(12) United States Patent
McMullan

(10) Patent No.: US 9,589,983 B2
(45) Date of Patent: Mar. 7, 2017

(54) EFFICIENT BURIED OXIDE LAYER INTERCONNECT SCHEME

(71) Applicant: Texas Instruments Incorporated, Dallas, TX (US)

(72) Inventor: Russell Carlton McMullan, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/172,536

(22) Filed: Jun. 3, 2016

(65) Prior Publication Data

US 2016/0284731 A1    Sep. 29, 2016

Related U.S. Application Data

(63) Continuation of application No. 14/614,395, filed on Feb. 4, 2015, now Pat. No. 9,385,140.

(51) Int. Cl.
*H01L 27/108* (2006.01)
*H01L 27/12* (2006.01)
(Continued)

(52) U.S. Cl.
CPC ...... *H01L 27/1203* (2013.01); *H01L 21/3212* (2013.01); *H01L 21/32051* (2013.01); *H01L 21/32055* (2013.01); *H01L 21/743* (2013.01); *H01L 21/7624* (2013.01); *H01L 21/7684* (2013.01); *H01L 21/76802* (2013.01); *H01L 21/76877* (2013.01); *H01L 21/76895* (2013.01); *H01L 21/76898* (2013.01); *H01L 21/84* (2013.01); *H01L 23/481* (2013.01); *H01L 23/528* (2013.01); *H01L 23/5223* (2013.01); *H01L 23/5226* (2013.01); *H01L 23/53257* (2013.01); *H01L 23/53271* (2013.01); *H01L 29/0649* (2013.01); *H01L 2924/0002* (2013.01)

(58) Field of Classification Search
CPC ............... H01L 27/1203; H01L 23/481; H01L 23/5223; H01L 23/5226; H01L 23/528; H01L 21/32051; H01L 21/32055; H01L 21/3212; H01L 21/743; H01L 21/7624; H01L 21/76802; H01L 21/7684; H01L 21/76877; H01L 21/76898
USPC ...................................................... 257/296
See application file for complete search history.

(56) References Cited

U.S. PATENT DOCUMENTS 8,030,707 B2 * 10/2011 Cheng .................... H01L 21/84
                                                                257/296
8,426,888 B2    4/2013 Molin et al.

* cited by examiner

*Primary Examiner* — Tu-Tu Ho
(74) *Attorney, Agent, or Firm* — Jaqueline J. Garner; Charles A. Brill; Frank D. Cimino

(57) ABSTRACT

An integrated circuit has a buried interconnect in the buried oxide layer connecting a body of a MOS transistor to a through-substrate via (TSV). The buried interconnect extends laterally past the TSV. The integrated circuit is formed by starting with a substrate, forming the buried oxide layer with the buried interconnect at a top surface of the substrate, and forming a semiconductor device layer over the buried oxide layer. The MOS transistor is formed in the semiconductor device layer so that the body makes an electrical connection to the buried interconnect. Subsequently, the TSV is formed through a bottom surface of the substrate so as to make an electrical connection to the buried interconnect in the buried oxide layer. A body of a transistor is electrically coupled to the TSV through the buried interconnect.

20 Claims, 12 Drawing Sheets

(51) Int. Cl.
*H01L 23/48* (2006.01)
*H01L 23/528* (2006.01)
*H01L 23/522* (2006.01)
*H01L 23/532* (2006.01)
*H01L 21/768* (2006.01)
*H01L 21/84* (2006.01)
*H01L 21/762* (2006.01)
*H01L 21/3205* (2006.01)
*H01L 21/321* (2006.01)
*H01L 29/06* (2006.01)
*H01L 21/74* (2006.01)

US 9,589,983 B2

EFFICIENT BURIED OXIDE LAYER INTERCONNECT SCHEME

CROSS REFERENCE TO RELATED APPLICATIONS

This application is a continuation of U.S. Nonprovisional patent application Ser. No. 14/614,395, filed Feb. 4, 2015, the contents of which are herein incorporated by reference in its entirety.

FIELD OF THE INVENTION

This invention relates to the field of integrated circuits. More particularly, this invention relates to integrated circuits with through-substrate vias.

BACKGROUND OF THE INVENTION

Integrated circuits containing logic circuits benefit from applying bias to bodies of metal oxide semiconductor (MOS) transistors in the logic circuits, to adjust power and speed of the MOS transistors. Metal interconnects and contacts to carry the biases to the MOS transistors undesirably increase the area of the logic circuits, adding to the cost of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit has a substrate, a buried oxide layer over the substrate and a semiconductor device layer over the buried oxide layer. Transistors are disposed in the semiconductor device layer, and metal interconnects of the integrated circuit are disposed over the transistors. A buried interconnect is disposed in the buried oxide layer, electrically coupling a body of at least one of the transistors to a through-substrate via (TSV). The buried interconnect extends laterally past the TSV. The integrated circuit is formed by starting with a substrate, forming the buried oxide layer with the buried interconnect at a top surface of the substrate, and forming a semiconductor device layer over the buried oxide layer. The MOS transistor is formed in the semiconductor device layer so that the body of the MOS transistor makes an electrical connection to the buried interconnect. Subsequently, the TSV is formed through the bottom surface of the substrate so as to make an electrical connection to the buried interconnect in the buried oxide layer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
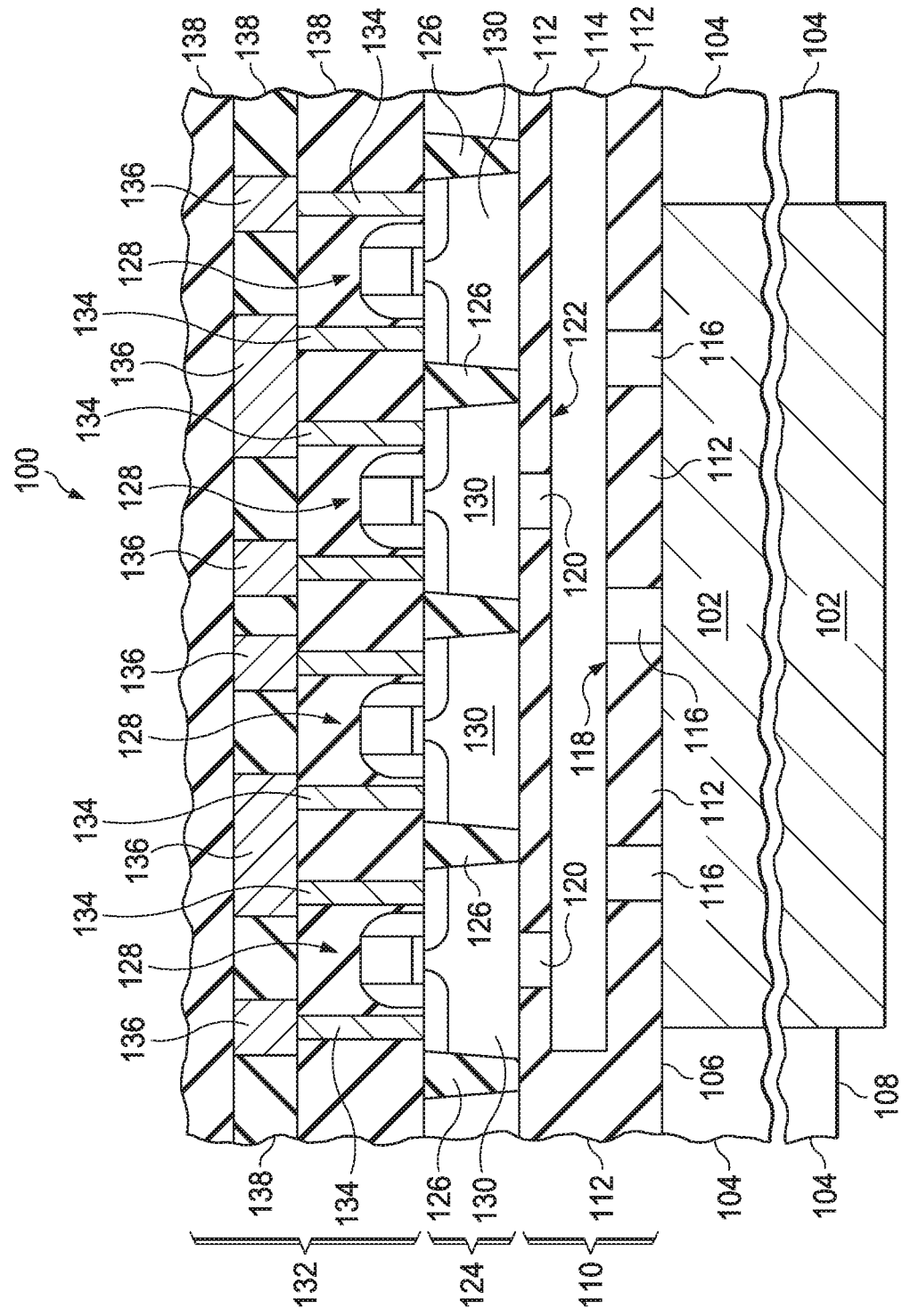
FIG. 1 is a cross section of an example integrated circuit.

FIG. 1 is a cross section of an example integrated circuit. The integrated circuit 100 has a TSV 102 through a substrate 104 of the integrated circuit 100. The substrate 104 may be, for example, from a silicon handle wafer. The TSV 102 is disposed through the substrate 104, extending from a top surface 106 of the substrate 104 proximate to a bottom surface 108 of the substrate 104. The TSV 102 may include copper.

A buried oxide layer 110 is disposed over the substrate 104 and TSV 102. The buried oxide layer 110 includes dielectric material 112 which may be primarily silicon dioxide-based material and may include one or more sublayers. An electrically conductive buried interconnect 114 is disposed in the buried oxide layer 110, extending over and laterally past the TSV 102. Electrically conductive lower vias 116 are disposed in the buried oxide layer 110, contacting a lower surface 118 of the buried interconnect 114 and contacting the TSV 102. Electrically conductive upper vias 120 are disposed in the buried oxide layer 110, contacting an upper surface 122 of the buried interconnect 114.

A semiconductor device layer 124 is disposed over the buried oxide layer 110. The semiconductor device layer 124 may be, for example, single-crystal silicon or an alloy semiconductor including silicon and germanium. Isolation structures 126 such as silicon dioxide shallow trench isolation (STI) structures may be disposed in the semiconductor device layer 124 to laterally isolate regions of the semiconductor device layer 124. A plurality of transistors 128 are disposed in the semiconductor device layer 124. A body 130 of at least one of the transistors 128 contacts at least one of the upper vias 120, so that the body 130 is electrically coupled to the TSV 102 through the buried interconnect 114.

An interconnect structure 132 is disposed over the semiconductor device layer 124 and over the transistors 128. The interconnect structure 132 includes contacts 134 and metal interconnects 136 disposed in a stack of dielectric layers 138. The contacts 134 and interconnects 136 provide electrical connections between the transistors 128.

During operation of the integrated circuit 100, an external bias may be applied to the TSV 102 which is conducted to the bodies 130 of the transistors 128 through the lower vias 116, the buried interconnect 114 and the upper vias 120, which may advantageously enable adjustment of speed and power consumption of the transistors 128. Providing the external bias to the bodies 130 through the TSV 102 and the lower vias 116, the buried interconnect 114 and the upper vias 120, instead of through the interconnect structure 132, may reduce an area of the integrated circuit 100 and hence advantageously reduce a cost of the integrated circuit 100.

The transistors 128 may be MOS transistors as depicted in FIG. 1. In variations of the instant example, the transistors 128 may alternatively be fin field effect transistors (finFETs) or other types of transistors.

Figure 2:
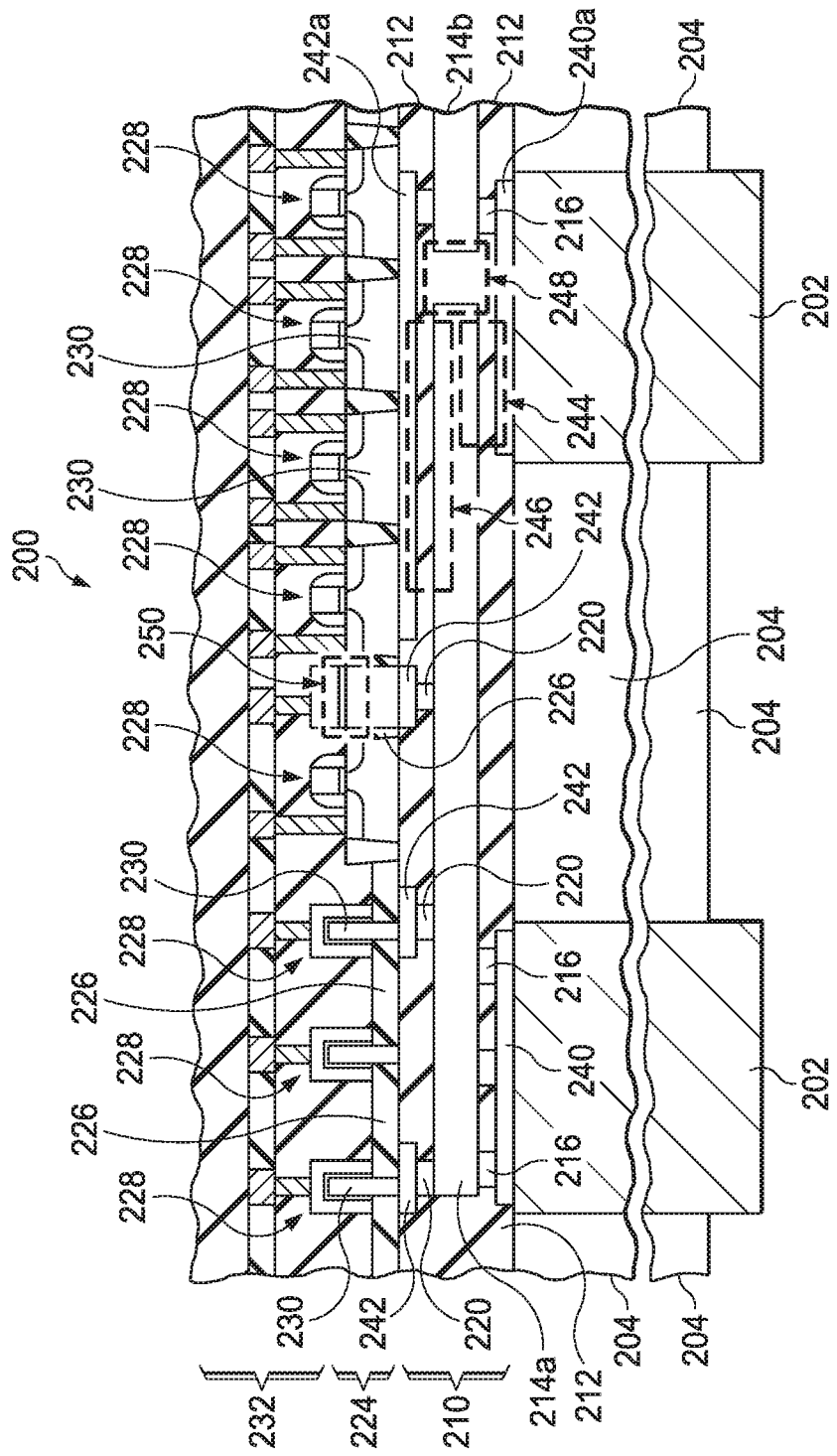
FIG. 2 is a cross section of another example integrated circuit.

FIG. 2 is a cross section of another example integrated circuit. The integrated circuit 200 has a plurality of TSVs 202 through a substrate 204, for example as described in reference to FIG. 1. A buried oxide layer 210 is disposed over the substrate 204 and the TSVs 202. The buried oxide layer 210 includes dielectric material 212 such as a plurality of sub-layers of silicon dioxide-based material. Electrically conductive buried interconnects 214 including first buried interconnect 214a and second buried interconnect 214b are disposed in the buried oxide layer 210. At least one of the buried interconnects 214 extends over and laterally past an underlying instance of the TSVs 202. Electrically conductive lower vias 216 are disposed in the buried oxide layer 210, contacting lower surfaces 218 of the buried interconnects 214. TSV landing pads 240 including first TSV landing pad 240a are disposed in the buried oxide layer 210 on the TSVs 202 and contacting the lower vias 216, so that the buried interconnects 214 are electrically coupled to the TSVs 202 through the lower vias 216 and TSV landing pads 240. Electrically conductive upper vias 220 are disposed in the buried oxide layer 210, contacting upper surfaces 222 of the buried interconnects 214. Transistor landing pads 242 including first transistor landing pad 242a are disposed in the buried oxide layer 210 above the buried interconnects 214, contacting the upper vias 220.

A semiconductor device layer 224 is disposed over the buried oxide layer 210. A plurality of transistors 228 are disposed in the semiconductor device layer 224. The plurality of transistors 228 may possibly include more than one type of transistor, such as MOS transistors and finFETs as depicted in FIG. 2. The transistors 228 may be laterally isolated by dielectric isolation structures 226. Bodies 230 of at least a portion of the transistors 228 contact at least a portion of the transistor landing pads 242, so that the bodies 230 are electrically coupled to the TSVs 202 through the transistor landing pads 242, the upper vias 220, the buried interconnects 214, the lower vias 216 and the TSV landing pads 240.

An interconnect structure 232 is disposed over the semiconductor device layer 224 and over the transistors 228. The interconnect structure 232 includes contacts and interconnects, and provides electrical connections between the transistors 228, as described in reference to FIG. 1. Providing the connections to the bodies 230 of the transistors 228 through the buried oxide layer 210 may provide a smaller area for the integrated circuit 200 as described in reference to FIG. 1.

In the instant example, first buried interconnect 214a overlaps first TSV landing pad 240a to provide a first decoupling capacitor 244. The first buried interconnect 214a underlaps first transistor landing pad 242a to provide a second decoupling capacitor 246. The first buried interconnect 214a is disposed adjacent to second buried interconnect 214b to provide a third decoupling capacitor 248. Providing the decoupling capacitors 244, 246 and/or 248 in the buried oxide layer 210 instead of in the interconnect structure 232 may reduce an area of the integrated circuit 200, advantageously reducing a cost of the integrated circuit 200. A fourth decoupling capacitor 250 is disposed over one of the isolation structures 226, and a connection to one plate of the fourth decoupling capacitor 250 extends into the buried oxide layer 210, which may also advantageously reduce the area of the integrated circuit 200.

Figure 3:
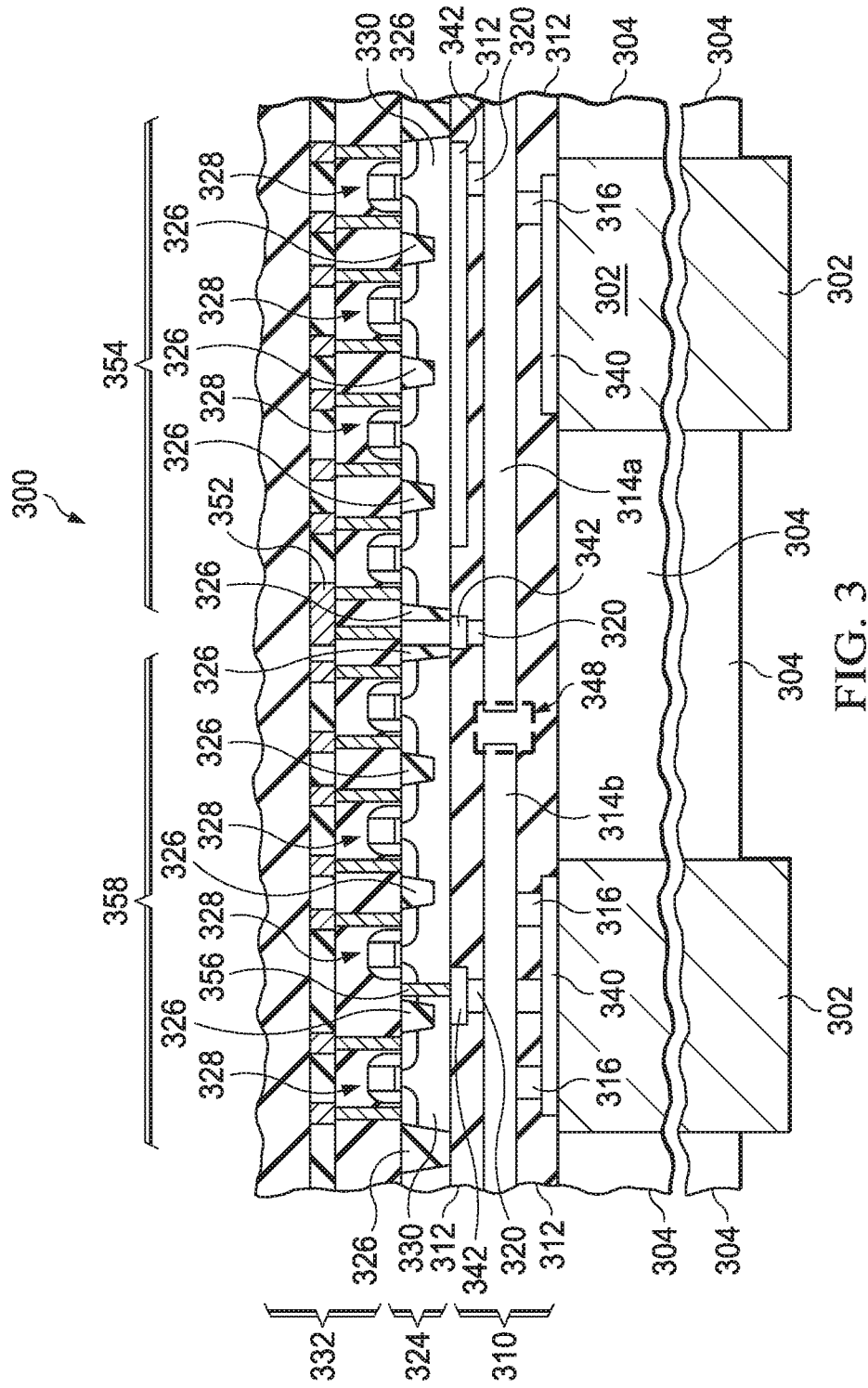
FIG. 3 is a cross section of a further example integrated circuit.

FIG. 3 is a cross section of a further example integrated circuit. The integrated circuit 300 has a plurality of TSVs 302 through a substrate 304, for example as described in reference to FIG. 1. A buried oxide layer 310 is disposed over the substrate 304 and the TSVs 302. A semiconductor device layer 324 with transistors 328 is disposed over the buried oxide layer 310. An interconnect structure 332 is disposed over the semiconductor device layer 324 and over the transistors 328, providing electrical connections between the transistors 328, as described in reference to FIG. 1.

The buried oxide layer 310 includes dielectric material 312 for example as described in reference to FIG. 1 and FIG. 2. Electrically conductive buried interconnects 314 including first buried interconnect 314a and second buried interconnect 314b are disposed in the dielectric material 312. At least one of the buried interconnects 314 extends over and laterally past an underlying instance of the TSVs 302. Upper vias 320 and transistor landing pads 342 are disposed in the buried oxide layer 310 above the buried interconnects 314. Lower vias 316 and TSV landing pads 340 are disposed in the buried oxide layer 310 below the buried interconnects 314. Bodies 330 of the transistors 328 are electrically coupled to one of the TSVs 302 through one of the transistor landing pad 342, one of the upper vias 320, one of the buried interconnects 314, one of the lower vias 316 and one of the TSV landing pads 340. Bodies 330 of the transistors 328 may be contacted by one or more of the transistor landing pads 342, so as to provide bias to the bodies 330 during operation of the integrated circuit 300, as described in reference to FIG. 1.

In the instant example, a first source node 352 of the integrated circuit 300, such as a $V_{DD}$ node or a $V_{SS}$ node, may be coupled to the first buried interconnect 314a through one of the transistor landing pads 342 and one of the upper vias 320. The first source node 352 may be routed through an isolation structure 326, advantageously reducing an area of the integrated circuit 300 compared to routing the first source node 352 through the interconnect structure 332. The first source node 352 may provide a source bias for first polarity transistors 354. If the first polarity transistors 354 are n-channel transistors, the first source node 352 may be a $V_{SS}$ node; if the first polarity transistors 354 are p-channel transistors, the first source node 352 may be a $V_{DD}$ node.

A second source node 356 of the integrated circuit 300 may routed through a body 330 of second polarity transistors 358 to the second buried interconnect 314b through another of the transistor landing pads 342 and another of the upper via 320. Routing the second source node 356 through the body 330 biases the body 330 to the potential of the second source node 356, advantageously reducing the area of the integrated circuit 300. The second source node 356 may have an opposite polarity from the first source node 352 and the second polarity transistors 358 may have an opposite polarity from the first polarity transistor 354.

A decoupling capacitor 348 may be provided by instances of the buried interconnects 314, transistor landing pads 342 and/or TSV landing pads 340 coupled to the first source node 352, and instances of the buried interconnects 314, transistor landing pads 342 and/or TSV landing pads 340 coupled to the second source node 356, for example between the first buried interconnect 314a and the second buried interconnect 314b as depicted in FIG. 3. Providing the decoupling capacitor 348 in the buried oxide layer 310 advantageously reduces the area of the integrated circuit 300 compared to providing the decoupling capacitor in the interconnect structure 332.

Figure 4:
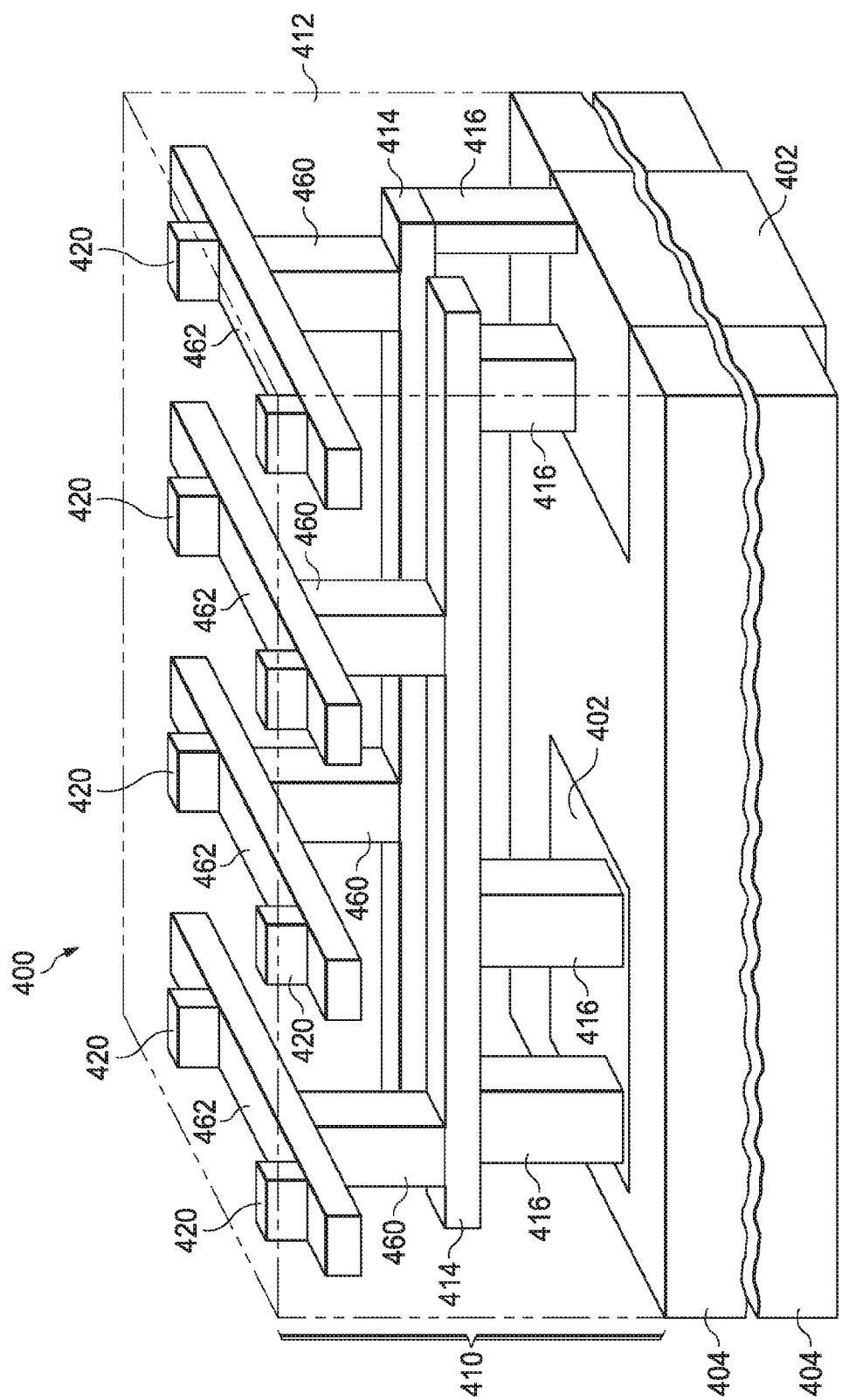
FIG. 4 is a cross section of another example integrated circuit.

FIG. 4 is a cross section of another example integrated circuit. The integrated circuit 400 has a plurality of TSVs 402 through a substrate 404, for example as described in reference to FIG. 1. A buried oxide layer 410 is disposed over the substrate 404 and the TSVs 402. A semiconductor device layer, not shown in FIG. 4, with transistors is disposed over the buried oxide layer 410. An interconnect structure, also not shown in FIG. 4, is disposed over the semiconductor device layer and over the transistors, providing electrical connections between the transistors, as described in reference to FIG. 1.

The buried oxide layer 410 includes dielectric material 412 which is shown in FIG. 4 with dotted lines to more clearly show electrical conductors in the buried oxide layer 410. In the instant example, the buried oxide layer 410 includes lower vias 416 contacting the TSVs 402. First buried interconnects 414 are disposed in the buried oxide layer 410, above and contacting the lower vias 416. The first buried interconnects 414 extend laterally past underlying instances of the TSVs 402. Middle vias 460 are disposed in the buried oxide layer 410, above and contacting the first buried interconnects 414. Second buried interconnects 462 are disposed in the buried oxide layer 410, above and contacting the middle vias 460. Upper vias 420 are disposed in the buried oxide layer 410, above and contacting the second buried interconnects 462. The upper vias 420 are coupled to bodies of the transistors. Instances of the upper vias 420 may optionally be coupled to source nodes of the integrated circuit 400 such as $V_{DD}$ and/or $V_{SS}$ nodes. Instances of the second buried interconnects 462 may be oriented perpendicular to instances of the first buried interconnects 414 to which they are electrically coupled, to advantageously enable connections between laterally dispersed transistors and a single TSV 402.

In a variation of the instant example, TSV landing pads may be disposed between the lower vias 416 and the TSVs 402, as described in reference to FIG. 1. In another variation, transistor landing pads may be disposed between the upper vias 420 and the semiconductor device layer, as described in reference to FIG. 1.

Figure 5A:
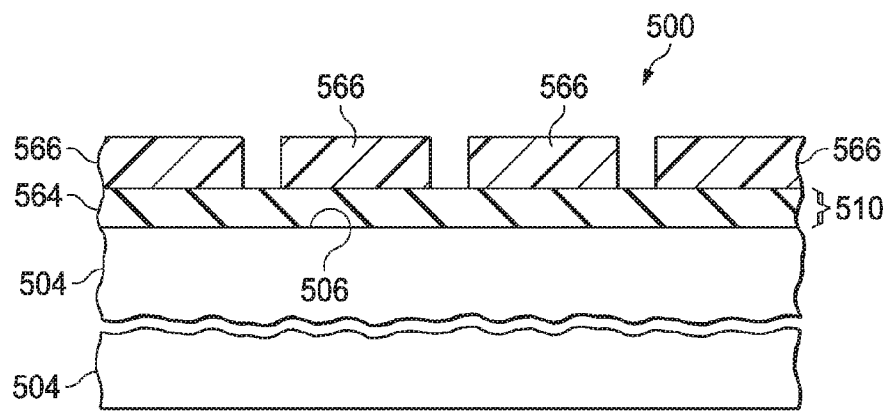
FIG. 5A through FIG. 5N are cross sections of an integrated circuit with buried interconnects in a buried oxide layer and TSVs, depicted in successive stages of an example fabrication sequence.
Figure 5B:
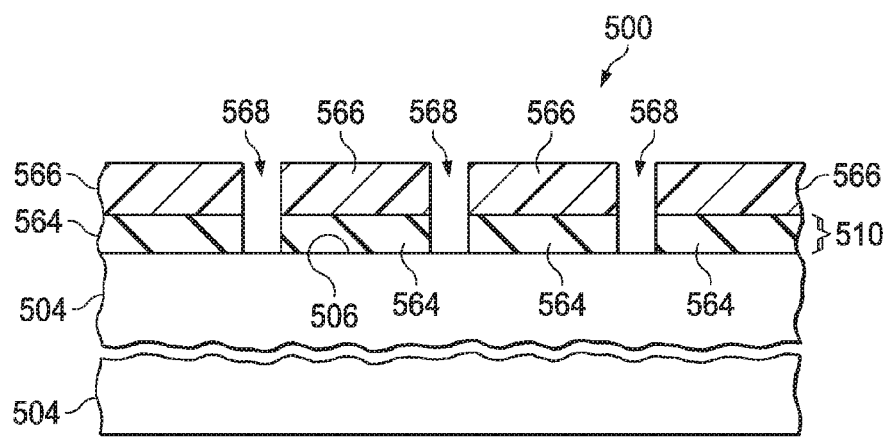
Figure 5C:
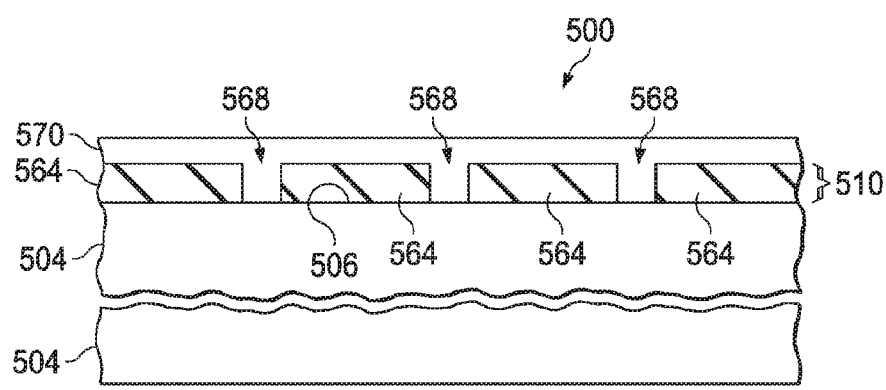
Figure 5D:
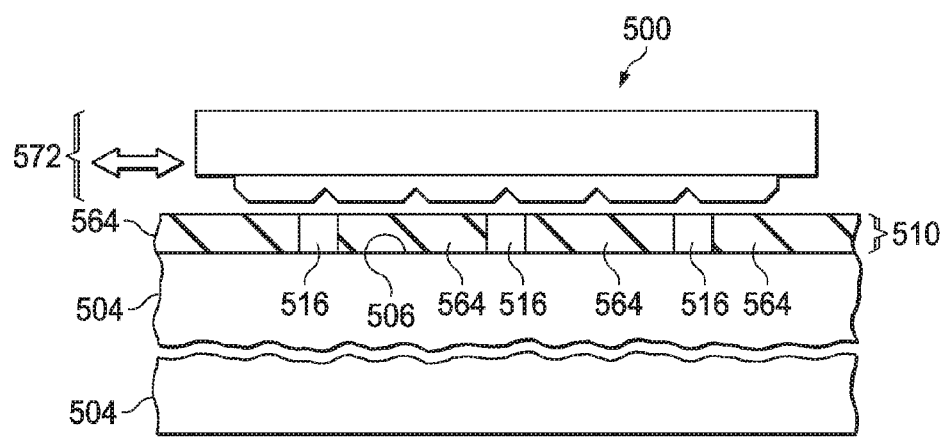
Figure 5E:
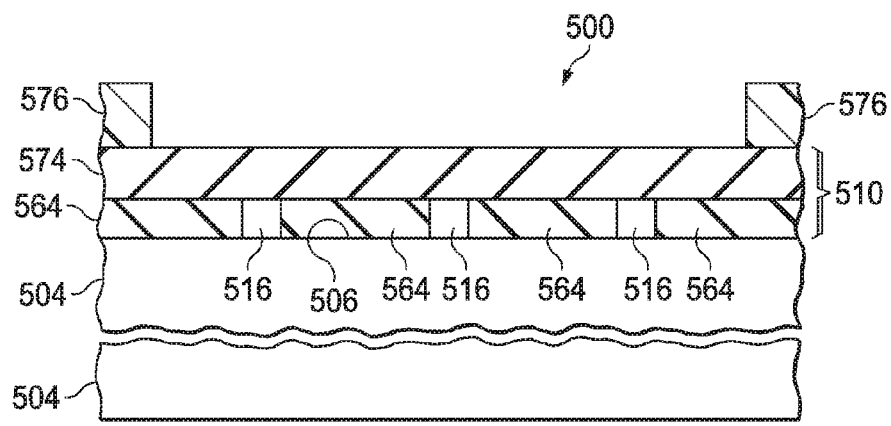
Figure 5F:
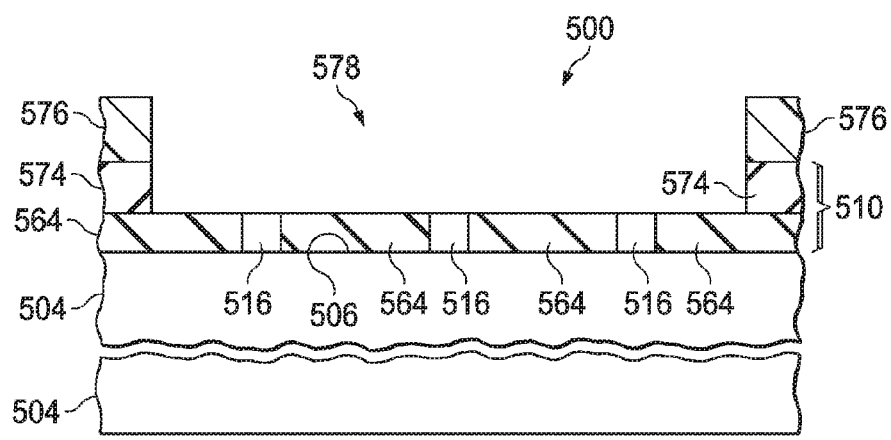
Figure 5G:
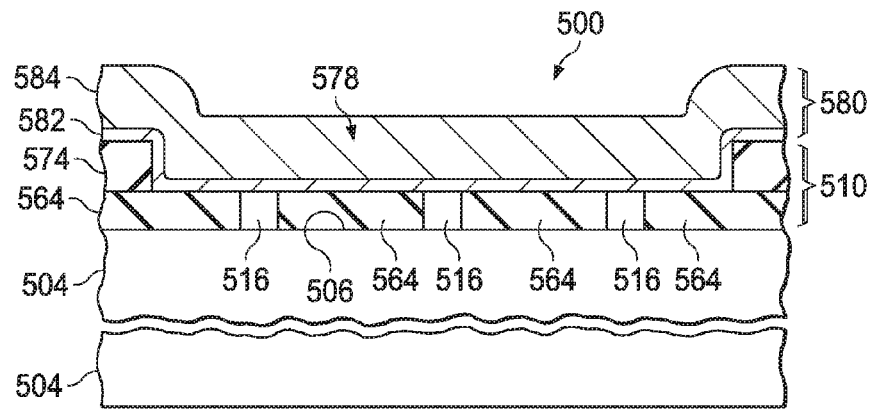
Figure 5H:
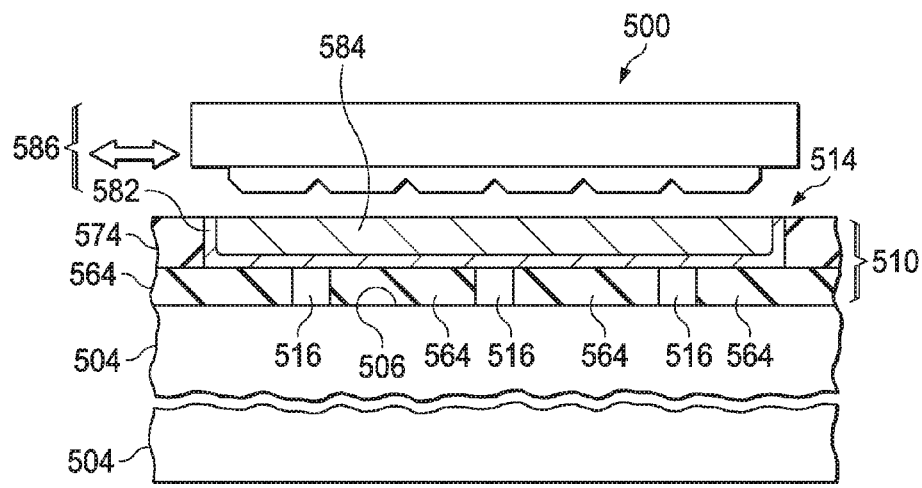
Figure 5I:
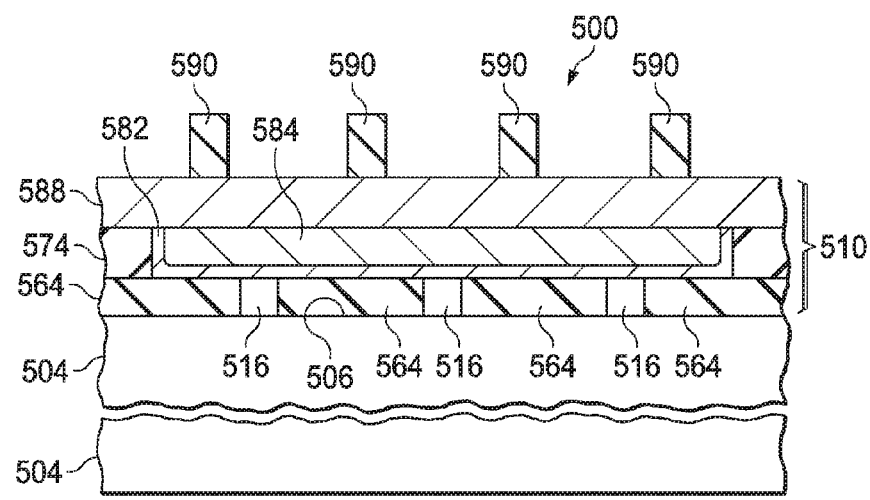
Figure 5J:
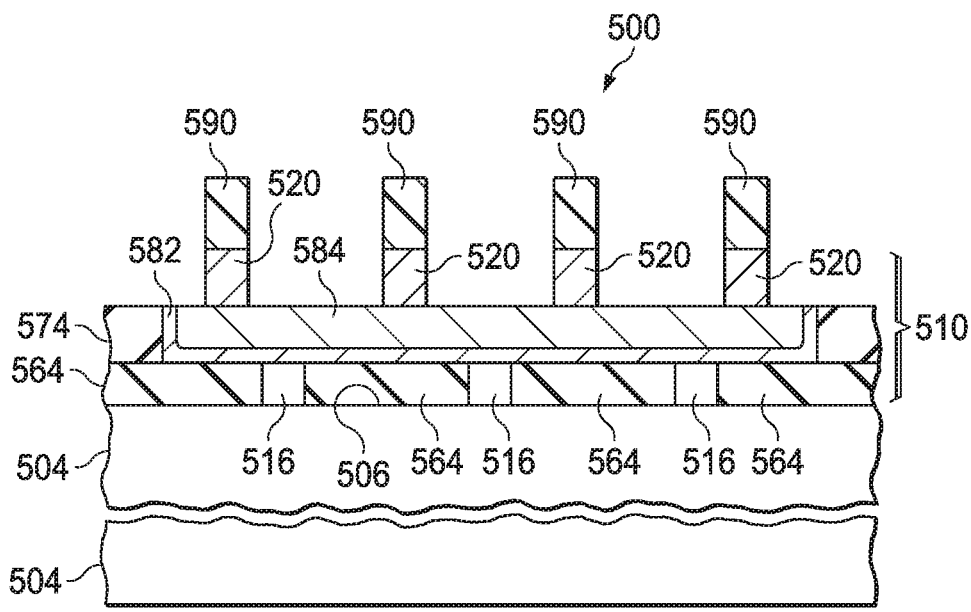
Figure 5K:
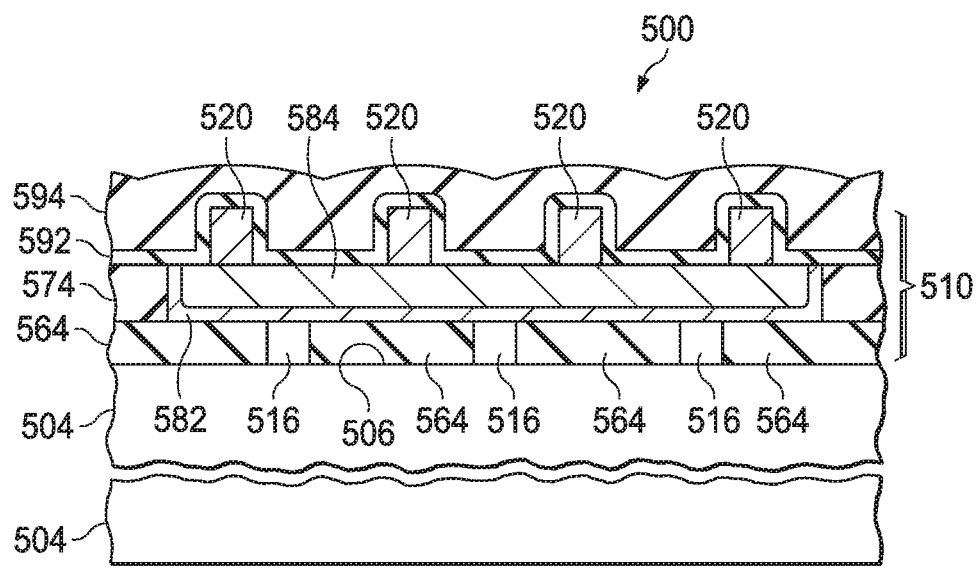
Figure 5L:
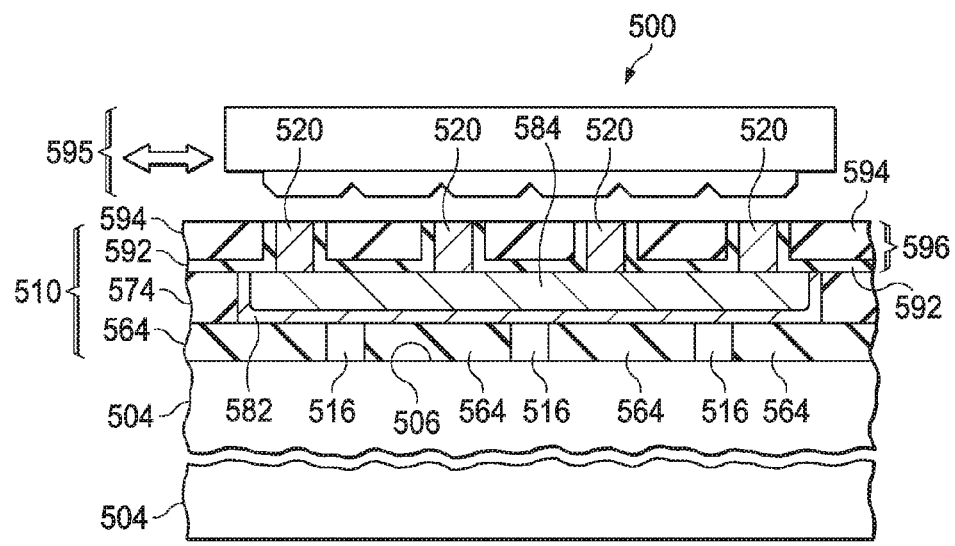
Figure 5M:
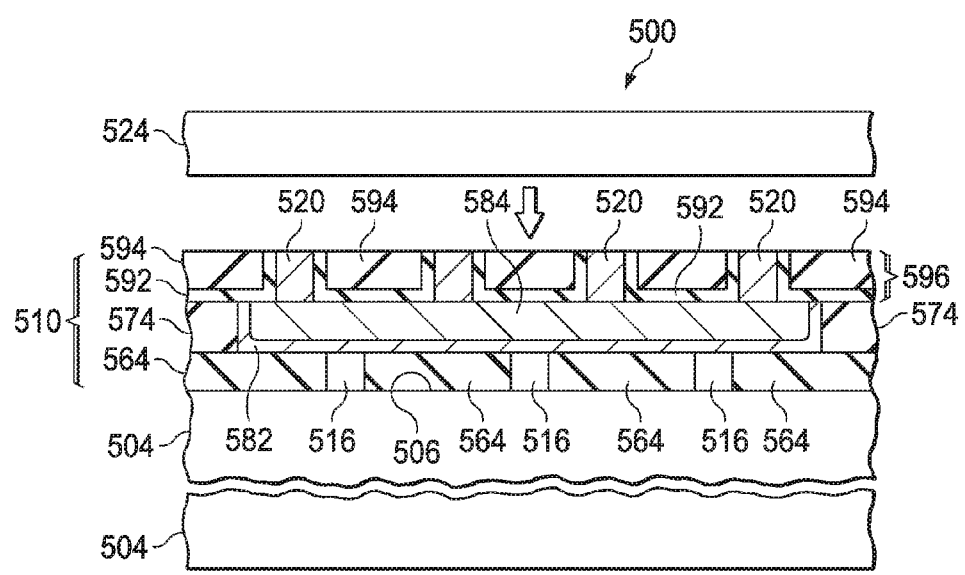
Figure 5N:
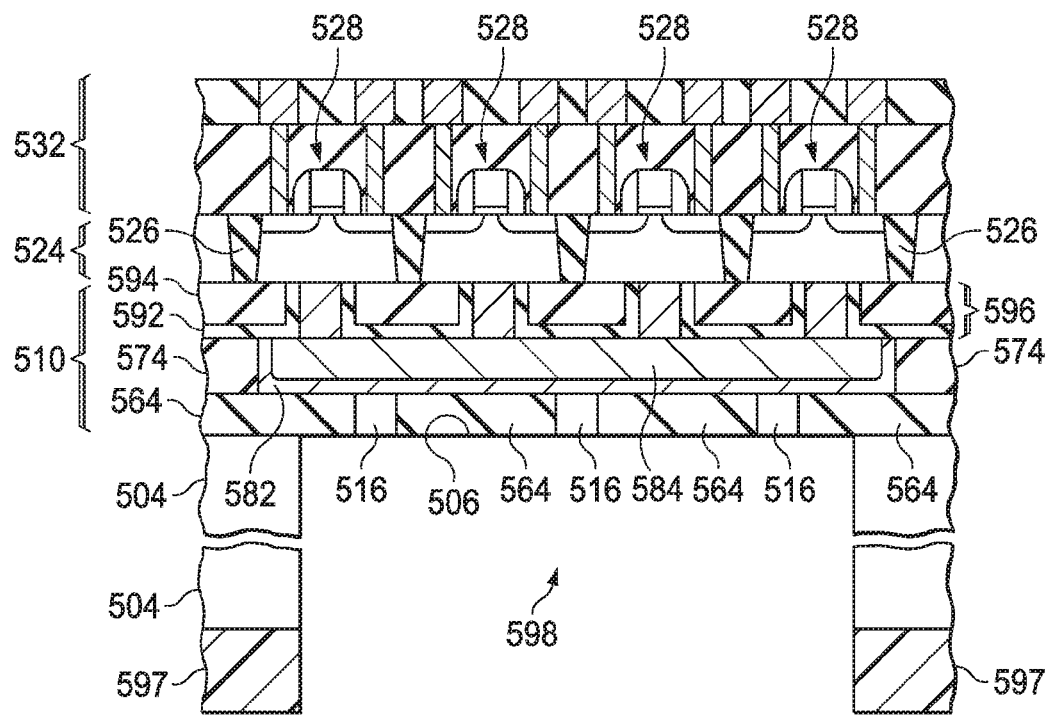

FIG. 5A through FIG. 5N are cross sections of an integrated circuit with buried interconnects in a buried oxide layer and TSVs, depicted in successive stages of an example fabrication sequence. Referring to FIG. 5A, formation of the integrated circuit 500 begins with providing a substrate 504 such as a silicon handle wafer. Other types of substrate are within the scope of the instant example. A first dielectric sub-layer 564 of a buried oxide layer 510 is formed at a top surface 506 of the substrate 504. The first dielectric sub-layer 564 may include primarily silicon dioxide-based material, and may be, for example, 50 nanometers to 200 nanometers thick. The first dielectric sub-layer 564 may be formed by thermal oxidation of silicon in the substrate 504 or may be formed by a plasma enhanced chemical vapor deposition (PECVD) process using tetraethyl orthosilicate, also known as tetraethoxysilane (TEOS), followed by a densification anneal. A via etch mask 566 is formed over the first dielectric sub-layer 564 which exposes areas for lower vias. The via etch mask 566 may include photoresist formed by a photolithographic process, and may possibly include hard mask material such as silicon nitride and/or anti-reflection material such as an organic bottom anti-reflection coat (BARC).

Referring to FIG. 5B, the first dielectric sub-layer 564 is removed in the areas exposed by the via etch mask 566 to form via holes 568 through the first dielectric sub-layer 564, exposing the top surface 506 of the substrate 504. The first dielectric sub-layer 564 may be removed, for example, by a wet etch process with a dilute aqueous solution of buffered hydrofluoric acid. The wet etch process may provide sloped sides in the via holes 568 which may advantageously facilitate subsequently filling the via holes 568 with electrically conductive material. Alternatively, the first dielectric sub-layer 564 may be removed, for another example, by a reactive ion etch (RIE) process. The RIE process may enable forming a plurality of the via holes 568 spaced closely together to advantageously provide lower electric resistance to an underlying TSV. The via etch mask 566 is subsequently removed. Organic material in the via etch mask 566 may be removed by an ash process followed by a wet clean process.

Referring to FIG. 5C, a layer of electrically conductive material 570 is formed over the first dielectric sub-layer 564, extending into and filling the via holes 568 and contacting the substrate 504. The layer of electrically conductive material 570 may include, for example polycrystalline silicon, referred to as polysilicon, doped with phosphorus to provide a desired resistivity. The polysilicon in the layer of electrically conductive material 570 may be formed by thermal decomposition of silane, and/or disilane. The phosphorus may be included in the polysilicon during formation of the layer of electrically conductive material 570 as in situ doping, or may be implanted after the layer of electrically conductive material 570 is formed. Other electrically conductive materials such as tungsten for the layer of electrically conductive material 570 are within the scope of the instant example.

Referring to FIG. 5D, the layer of electrically conductive material 570 of FIG. 5C over a top surface of the first dielectric sub-layer 564 is removed, for example by a polysilicon chemical mechanical polish (CMP) process 572, depicted schematically in FIG. 5D by the CMP pad, leaving electrically conductive material in the via holes 568 of FIG. 5C to provide lower vias 516. Alternatively, the layer of electrically conductive material 570 may be removed by an etchback process, or a combination of an etchback process and a polysilicon CMP process. Other methods of forming the lower vias 516 such as etching a conductive layer using an etch mask are within the scope of the instant example.

Referring to FIG. 5E, a second dielectric sub-layer 574 of the buried oxide layer 510 is formed over the first dielectric sub-layer 564 and the lower vias 516. The second dielectric sub-layer 574 may include primarily silicon dioxide-based material, and may be, for example, 100 nanometers to 500 nanometers thick. The second dielectric sub-layer 574 may be formed by a PECVD process using TEOS, followed by a densification anneal. A trench etch mask 576 is formed over the second dielectric sub-layer 574 which exposes areas for buried interconnects. The trench etch mask 576 may be formed similarly to the via etch mask 566 of FIG. 5A.

Referring to FIG. 5F, the second dielectric sub-layer 574 is removed in the areas exposed by the trench etch mask 576 of FIG. 5E to form a trench 578 through the second dielectric sub-layer 574, exposing the lower vias 516. The second dielectric sub-layer 574 may be removed, for example, by an RIE process. The trench etch mask 576 is subsequently removed, for example as described in reference to FIG. 5B.

Referring to FIG. 5G, a layer of interconnect material 580 is formed over the second dielectric sub-layer 574, filling the trench 578 and contacting the lower vias 516. The layer of interconnect material 580 may include a liner 582 of 5 nanometers to 30 nanometers of tantalum, tantalum nitride, titanium and/or titanium nitride, contacting the lower vias 516, and a fill metal 584 of tungsten on the liner 582. The liner 582 may be formed by sputtering and/or reactive sputtering, or atomic layer deposition (ALD). The fill metal 584 may be formed by a metal organic chemical vapor deposition (MOCVD) process using silane and then hydrogen to reduce tungsten hexafluoride. Other electrically conductive materials such as polysilicon for the layer of interconnect material 580 are within the scope of the instant example.

Referring to FIG. 5H, the layer of interconnect material 580 of FIG. 5G over the second dielectric sub-layer 574 is removed, leaving the liner 582 and fill metal 584 in the trench 578 to form a buried interconnect 514. The layer of interconnect material 580 may be removed by a tungsten CMP process 586, depicted schematically in FIG. 5H by the CMP Pad.

Referring to FIG. 5I, an electrically conductive via conductor layer 588 is formed on the second dielectric sub-layer 574 and the buried interconnect 514. The via conductor layer 588 may include, for example, 5 nanometers to 20 nanometers of sputtered titanium as an adhesion layer, and 50 nanometers to 200 nanometers of polysilicon. Other electrically conductive materials for the via conductor layer 588 are within the scope of the instant example. A via plug mask 590 is formed over the via conductor layer 588 to cover areas for upper vias. The via plug mask 590 may be formed as described in reference to FIG. 5A.

Referring to FIG. 5J, the via conductor layer 588 of FIG. 5I is removed in areas exposed by the via plug mask 590, leaving the electrically conductive material on the buried interconnect 514 to form upper vias 520. The via conductor layer 588 may be removed, in one example, by an RIE process, which may advantageously enable closely spaced instances of the upper vias 520. In another example, the via conductor layer 588 may be removed by a wet etch process using an aqueous solution of tri-methyl ammonium hydroxide, which may provide sloped sides of the upper vias 520, advantageously facilitating formation of an subsequent dielectric layer between the upper vias 520. The via plug mask 590 is subsequently removed, for example as described in reference to FIG. 5B.

Referring to FIG. 5K, a conformal layer of dielectric material 592 is formed over the upper vias 520, the buried interconnect 514 and the second dielectric sub-layer 574. The conformal layer of dielectric material 592 may be, for example, 15 nanometers to 50 nanometers thick. The conformal layer of dielectric material 592 may include primarily silicon dioxide formed by a PECVD process using TEOS. A fill layer of dielectric material 594 is formed over the conformal layer of dielectric material 592, filling in spaces between the upper vias 520. The fill layer of dielectric material 594 may be formed, for example, by a high aspect ratio process (HARP) using ozone and TEOS, by a high density plasma (HDP) process, or by a spin-on process using methylsilsesquioxane (MSQ) followed by a densification anneal.

Referring to FIG. 5L, the fill layer of dielectric material 594 and the conformal layer of dielectric material 592 over the upper vias 520 are removed, for example by an oxide CMP process 595, depicted schematically in FIG. 5L by the CMP pad. The fill layer of dielectric material 594 and the conformal layer of dielectric material 592 remaining between the upper vias 520 provides a third dielectric sub-layer 596 of the buried oxide layer 510. Other methods of forming the third dielectric sub-layer 596 are within the scope of the instant example.

Referring to FIG. 5M, a semiconductor device layer 524 is attached to the buried oxide layer 510. The semiconductor device layer 524 may be, for example, a separate semiconductor layer which is physically united with the buried oxide layer 510 as indicated in FIG. 5M. Alternatively, one or more semiconductor seed layers may be formed on the buried oxide layer 510 and the semiconductor device layer 524 formed on the seed layers by an epitaxial growth process. Other methods of forming the semiconductor device layer 524 on the buried oxide layer 510 are within the scope of the instant example.

Referring to FIG. 5N, isolation structures 526 may be formed in the semiconductor device layer 524, for example by an STI process. Transistors 528 are formed in the semiconductor device layer 524. Bodies of the transistors 528 are electrically coupled to the upper vias 520. An interconnect structure 532 is formed over the semiconductor device layer 524 to provide electrical connections between the transistors 528. Subsequently, a TSV mask 597 is formed on a bottom surface 508 of the substrate 504 which exposes areas for TSVs. Material is removed from the substrate 504 in the areas exposed by the TSV mask 597 to form a TSV hole 598 which extends to the buried oxide layer 510. The material may be removed from the substrate 504 using a deep reactive ion etch (DRIE) process or a Bosch process, which alternately passivates sidewalls of the TSV hole 598 and etches material from a bottom of the TSV hole 598. The TSV mask 597 is removed, and a TSV is formed in the TSV hole 598 to form a structure similar to the examples described in reference to FIG. 1 through FIG. 3.

Figure 6A:
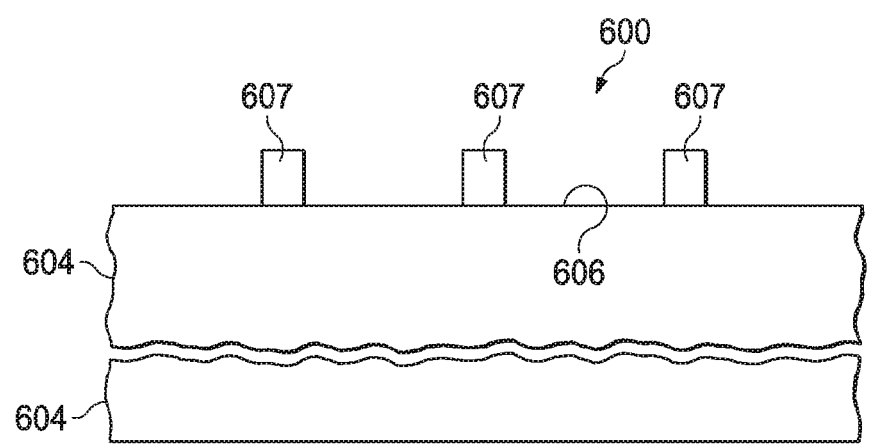
FIG. 6A through FIG. 6D are cross sections of an integrated circuit with buried interconnects in a buried oxide layer and TSVs, depicted in successive stages of an example fabrication sequence for forming lower vias.

FIG. 6A through FIG. 6D are cross sections of an integrated circuit with buried interconnects in a buried oxide layer and TSVs, depicted in successive stages of an example fabrication sequence for forming lower vias. Referring to FIG. 6A, formation of the integrated circuit 600 begins with providing a substrate 604 such as a silicon handle wafer. In the instant example, the substrate 604 has a bulk resistivity less than 1 ohm-cm at a top surface 606. A via plug mask 607 is formed over the top surface 606 of the substrate 604, covering areas for lower vias. The via plug mask 607 may include photoresist formed by a photolithographic process, and may optionally include a hard mask layer and/or an anti-reflection layer.

Figure 6B:
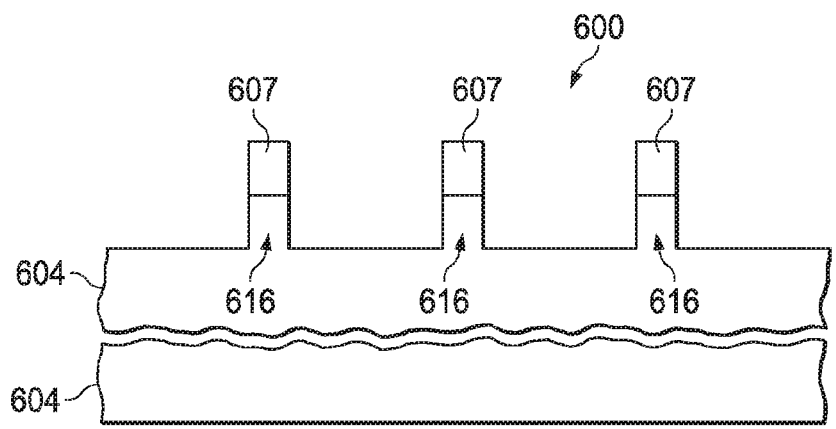

Referring to FIG. 6B, material is removed from the substrate 604 where exposed by the via plug mask 607, leaving substrate material under the via plug mask 607 to form lower vias 616. The substrate material may be removed by a timed etch, for example a timed RIE process or a timed wet etch. The via plug mask 607 is subsequently removed.

Figure 6C:
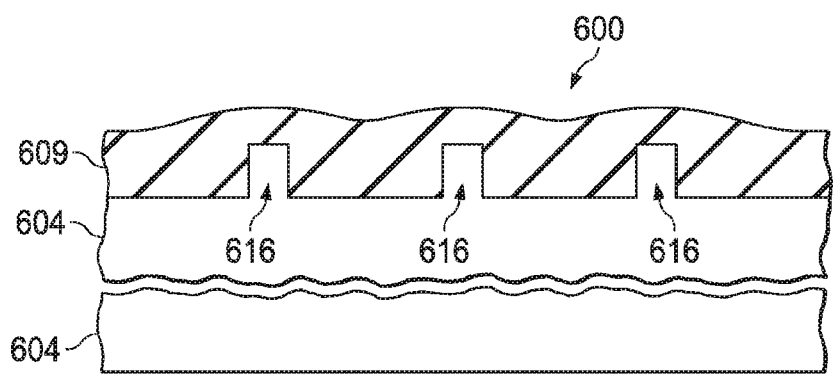

Referring to FIG. 6C, a layer of dielectric material 609 is formed over the substrate 604 and the lower vias 616, filling spaces between the lower vias 616. The layer of dielectric material 609 may include primarily silicon dioxide and may be formed by any of the processes described herein. The layer of dielectric material 609 may be annealed to densify the dielectric material.

Figure 6D:
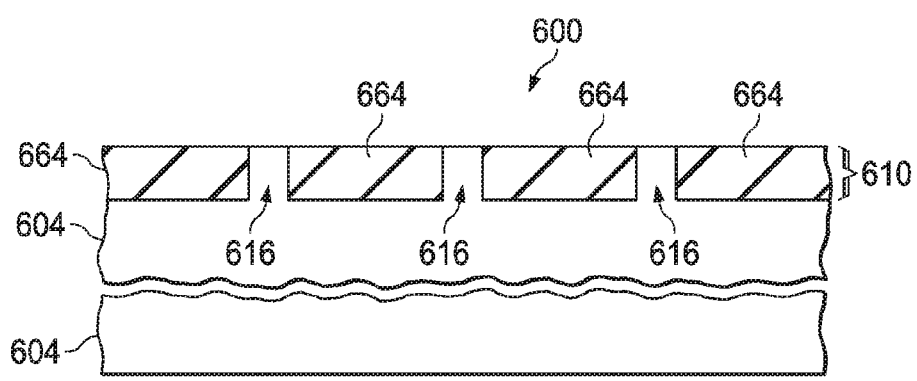

Referring to FIG. 6D, the layer of dielectric material 609 of FIG. 6C is planarized so as to expose the lower vias 616, leaving dielectric material between the lower vias 616 to form a first dielectric sub-layer 664 of the buried oxide layer 610. A buried interconnect and upper vias of the buried oxide layer are subsequently formed, as well as a semiconductor device layer with transistors and an interconnect structure. A TSV is formed in the substrate 604 to connect to the lower vias 616, to provide a structure similar to that depicted in FIG. 1. Forming the lower vias 616 of the substrate material may advantageously reduce fabrication cost and complexity of the integrated circuit 600.

Figure 7:
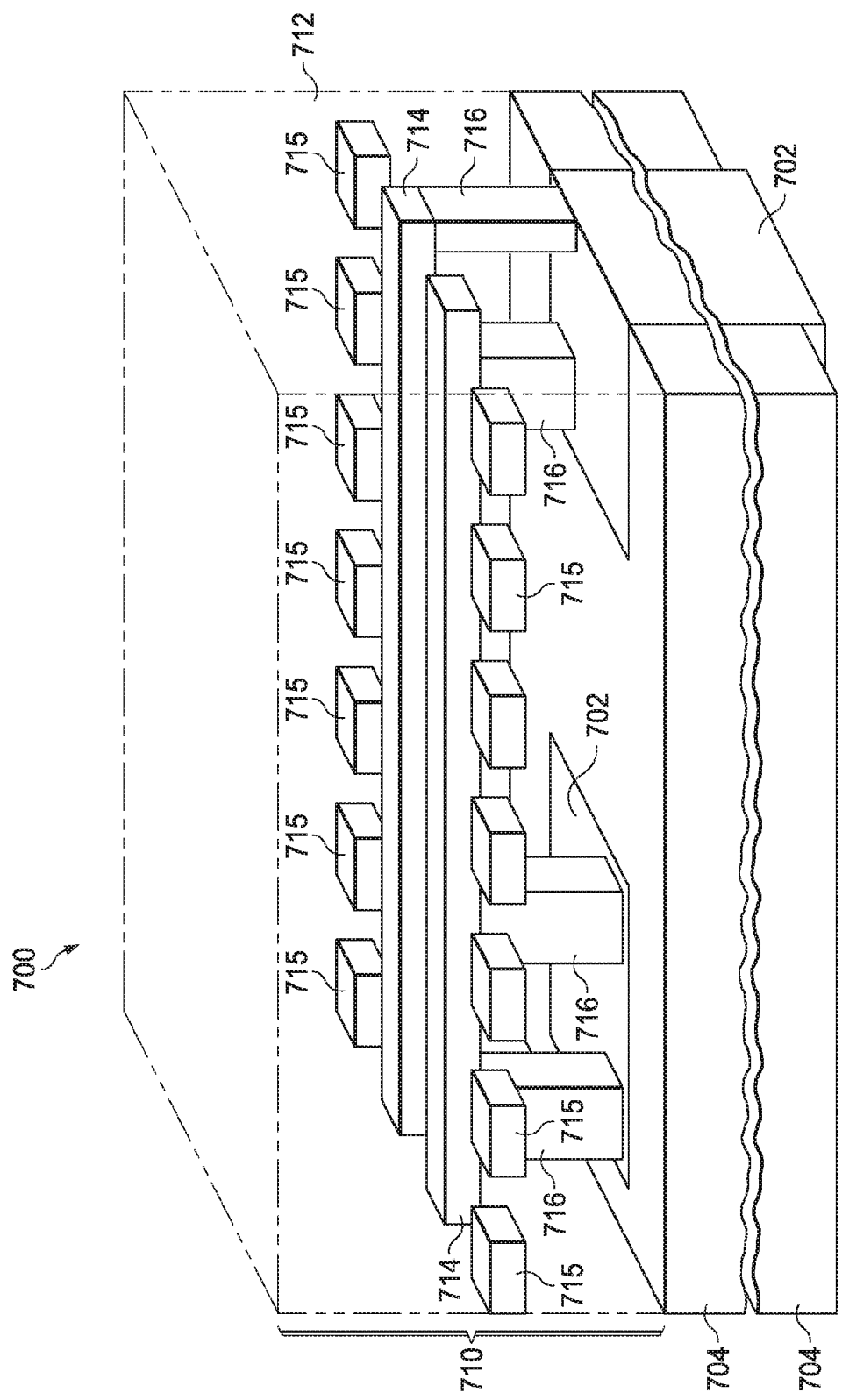
FIG. 7 is a cross section of another example integrated circuit.

FIG. 7 is a cross section of another example integrated circuit. The integrated circuit 700 has a plurality of TSVs 702 through a substrate 704, for example as described in reference to FIG. 1. A buried oxide layer 710 is disposed over the substrate 704 and the TSVs 702. A semiconductor device layer, not shown in FIG. 7, with transistors is disposed over the buried oxide layer 710. An interconnect structure, also not shown in FIG. 7, is disposed over the semiconductor device layer and over the transistors, providing electrical connections between the transistors, as described in reference to FIG. 1.

The buried oxide layer 710 includes dielectric material 712 which is shown in FIG. 7 with dotted lines to more clearly show electrical conductors in the buried oxide layer 710. In the instant example, the buried oxide layer 710 includes lower vias 716 contacting the TSVs 702. Buried interconnects 714 are disposed in the buried oxide layer 710, above and contacting the lower vias 716. The buried interconnects 714 extend laterally past underlying instances of the TSVs 702. In the instant example, dummy buried interconnect elements 715 are disposed laterally adjacent to the buried interconnects 714. The dummy buried interconnect elements 715 are not electrically coupled to transistors in the semiconductor device layer. The dummy buried interconnect elements 715 are formed concurrently with the buried interconnects 714. The dummy buried interconnect elements 715 may have lateral dimensions which 100 percent to 500 percent of widths of the buried interconnects 714. The dummy buried interconnect elements 715 may be spaced from each other and from the buried interconnects 714 at 100 percent to 400 percent of spaces separating adjacent instances of the buried interconnects 714. The dummy buried interconnect elements 715 may advantageously provide substantially uniform stress in the buried oxide layer 710 due to stress differences between the material of the buried interconnects 714 and the surrounding dielectric material 712.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate having a top surface and a bottom surface opposite the top surface;
a first through-substrate via (TSV) extending through the substrate from the top surface of the substrate to proximate to the bottom surface of the substrate;
a buried oxide layer disposed over the top surface of the substrate; comprising:
dielectric material; and
a first buried interconnect disposed in the dielectric material, extending over and laterally beyond edges of the first TSV;
a semiconductor device layer disposed over the buried oxide layer;
a first transistor disposed in the semiconductor device layer, wherein a body of the first transistor is electrically coupled to the first TSV through the first buried interconnect.

2. The integrated circuit of claim 1, wherein the buried oxide layer comprises:
an upper via electrically coupled to the first buried interconnect; and
a lower via electrically coupled between the first TSV and the first buried interconnect.

3. The integrated circuit of claim 2, wherein the buried oxide layer comprises:
a transistor landing pad, contacting the upper via and contacting the body of the first transistor; and
a TSV landing pad, contacting the lower via and contacting the first TSV.

4. The integrated circuit of claim 1, wherein the buried oxide layer comprises a decoupling capacitor, wherein the first buried interconnect provides one plate of the decoupling capacitor.

5. The integrated circuit of claim 1, wherein:
the integrated circuit comprises a second TSV through the substrate;
the integrated circuit comprises a second transistor in the semiconductor device layer;
the buried oxide layer comprises a second buried interconnect extending over and laterally past the second TSV; and
a source node of the second transistor is electrically coupled to the second TSV through the second buried interconnect.

6. The integrated circuit of claim 5, wherein the buried oxide layer comprises a decoupling capacitor, wherein the second buried interconnect provides one plate of the decoupling capacitor.

7. The integrated circuit of claim 1, wherein the first buried interconnect comprises polysilicon.

8. The integrated circuit of claim 1, wherein the first buried interconnect comprises tungsten.

9. The integrated circuit of claim 1, wherein the upper via comprises polysilicon and the lower via comprises polysilicon.

10. The integrated circuit of claim 1, wherein the buried oxide layer comprises a second buried interconnect above the first buried interconnect, and comprises a middle via coupled between the first buried interconnect and the second buried interconnect.

11. The integrated circuit of claim 1, wherein the buried oxide layer comprises a plurality of dummy buried interconnect elements disposed laterally adjacent to the first buried interconnect, wherein the dummy buried interconnect elements are free of electrical connections to the semiconductor device layer.

12. A method of forming an integrated circuit, comprising the steps:
forming a buried oxide layer over a substrate;
forming a buried interconnect in the buried oxide layer;
forming a semiconductor device layer over the buried oxide layer;

forming a first transistor in the semiconductor device layer; and forming a TSV through the substrate extending to the buried oxide layer, wherein a body of the first transistor is electrically coupled to the TSV through the buried interconnect, and wherein the buried interconnect extends laterally beyond edges of the TSV.

13. The method of claim 12, wherein forming the buried oxide layer comprises:

forming a first dielectric sub layer of the buried oxide over the substrate;

forming a lower via of the buried oxide layer in the first dielectric sub layer;

forming a second dielectric sub layer of the buried oxide layer above the first dielectric sub layer, wherein the buried interconnect is formed in the second dielectric sub layer;

forming a third dielectric sub layer of the buried oxide layer above the second dielectric sub layer; and forming an upper via of the buried oxide layer in the third dielectric sub layer, contacting the buried interconnect;

and wherein forming the lower via comprises the steps:

forming a via hole in the first dielectric sub-layer;

forming layer of electrically conductive material over the first dielectric sub-layer, filling the via hole; and removing the layer of electrically conductive material from over the first dielectric sub-layer, leaving electrically conductive material of the layer of electrically conductive material in the via hole to provide the lower via.

14. The method of claim 13, wherein the layer of electrically conductive material comprises polysilicon.

15. The method of claim 13, wherein the layer of electrically conductive material comprises tungsten.

16. The method of claim 13, wherein forming the lower via comprises the steps:

forming a via plug mask over electrically conductive material, the via plug mask covering an area for the lower via;

removing the electrically conductive material where exposed by the via plug mask, leaving the electrically conductive material under the via plug mask to provide the lower via; and forming the first dielectric sub-layer around the lower via.

17. The method of claim 13, wherein forming the buried interconnect comprises the steps:

forming a trench in the second dielectric sub-layer;

forming a layer of interconnect material over the second dielectric sub-layer, filling the trench; and removing the layer of interconnect material from over the second dielectric sub-layer, leaving interconnect material of the layer of interconnect material in the trench to provide the buried interconnect.

18. The method of claim 17, wherein the layer of interconnect material comprises polysilicon.

19. The method of claim 17, wherein the layer of interconnect material comprises tungsten.

20. The method of claim 17, wherein removing the layer of interconnect material from over the second dielectric sub-layer comprises a chemical mechanical polish (CMP) process.

* * * * *